United States Patent
Nakamura

(10) Patent No.: US 6,826,463 B2
(45) Date of Patent: Nov. 30, 2004

(54) IN-VEHICLE BUTTON-STUCK MALFUNCTION NOTICE SYSTEM

(75) Inventor: Shuzi Nakamura, Chita-gun (JP)

(73) Assignee: Denso Corporation, Kariya (JP)

(*) Notice: Subject to any disclaimer, the term of this patent is extended or adjusted under 35 U.S.C. 154(b) by 26 days.

(21) Appl. No.: 10/360,061

(22) Filed: Feb. 6, 2003

(65) Prior Publication Data

US 2003/0154008 A1 Aug. 14, 2003

(30) Foreign Application Priority Data

Feb. 12, 2002 (JP) .................................. 2002-034162

(51) Int. Cl.[7] .................... G08G 1/123; G01M 15/00
(52) U.S. Cl. .................... 701/29; 701/34; 340/425.5; 340/527; 340/529
(58) Field of Search .................... 701/29, 34, 36; 340/425.5, 527, 528, 529; 307/10.5; 187/381

(56) References Cited

U.S. PATENT DOCUMENTS

| | | | |
|---|---|---|---|
| 4,115,754 A | * 9/1978 | Duzich | 340/971 |
| 4,648,488 A | * 3/1987 | Martin et al. | 187/381 |
| 5,850,188 A | * 12/1998 | Doyle et al. | 340/825.69 |
| 5,960,362 A | * 9/1999 | Grob et al. | 455/527 |
| 5,983,114 A | * 11/1999 | Yao et al. | 455/509 |
| 6,182,445 B1 | * 2/2001 | Yamazaki et al. | 60/277 |

FOREIGN PATENT DOCUMENTS

JP    P3070850    5/2000

* cited by examiner

*Primary Examiner*—Thomas G. Black
*Assistant Examiner*—Arthur D. Donnelly

(57) ABSTRACT

An in-vehicle electronic control unit is equipped with the following: a control section for detecting a button-pushed state; a button-stuck notifying function for notifying button-stuck malfunction information that button-stuck malfunction occurs when the button-pushed state continues for more than a predetermined period; a non-volatile memory for storing the button-stuck malfunction information; and a button-stuck re-notifying function for immediately notifying the button-stuck malfunction information when the button-stuck malfunction information is stored in the memory, when the control section detects the button-pushed state, and when the electric power is turned off and then turned on.

8 Claims, 3 Drawing Sheets

IN-VEHICLE BUTTON-STUCK MALFUNCTION NOTICE SYSTEM

CROSS REFERENCE TO RELATED APPLICATIONS

This application is based on and incorporates herein by reference Japanese Patent Application No. 2002-34162 filed on Feb. 12, 2002.

FIELD OF THE INVENTION

The present invention relates to a malfunction notice system of manipulation buttons that a crew of a vehicle manipulates in the vehicle. In particular, the system operates quickly in a case that the malfunction of the manipulation buttons has been occurring since a time before an engine of the vehicle stopped until a time after the engine restarted.

BACKGROUND OF THE INVENTION

In some types of manipulation buttons of electronic devices, pulse signals for executing predetermined processing are outputted from the manipulation buttons to the electronic device. Here, a user pushes the predetermined buttons and releases them. Some in-vehicle electronic devices have a self-diagnostic function in which malfunction of the manipulation button is notified to the user, a crew of the vehicle. An effect that the manipulation button is malfunctioned is outputted on an in-vehicle display such as LED or LCD.

In JP-P3070850, an in-vehicle emergency call device includes a notice system. The system detects an electric open circuit state due to wire breakage of a manipulation button, or a short circuit state due to short-circuited disconnection of the manipulation button to notify through an indicator.

As one of malfunctions in the manipulation button, a button-stuck malfunction occurs in the in-vehicle electronic device. The button-stuck malfunction is for the manipulation button to remain in a pushed state (button-pushed state) due to mechanical reason such as hooking of the button or electrical reason such as transmission line breakdown. A button-stuck malfunction notice system can be therefore a practical self-diagnostic function.

In the button-stuck malfunction notice system, the button-stuck malfunction is determined, to prevent misjudging, after the button-pushed state continues for a predetermined continuous period X (e.g., two minutes).

Once the button-stuck malfunction is determined, it continues to be notified to the crew of the vehicle until the button-pushed state is released or main power of the vehicle is turned off. Namely, the determination of the button-stuck malfunction is initialized when the main power is turned off and then turned on. The continuous period X of the button-pushed state is newly started after the main power is turned on.

A processing flowchart of one instance of the button-stuck malfunction notice system is shown in FIG. 3. When an engine starts at Step 600, the button-stuck malfunction system initializes itself to start by being supplied with electric power. When the system afterward detects the button-pushed state for the predetermined continuous period X, the button-stuck malfunction is determined at Step 610. An effect that the button-stuck malfunction is determined is outputted on a display and notified to a crew at Step 620.

When the engine stops and the main power is turned off at Step 630, the button-stuck malfunction notice system stops its processing through shutting off of the power supply. When the engine restarts at Step 640, the button-stuck malfunction notice system is supplied with the power and initializes itself to restart the processing. If the button-pushed state continues through turning off and on of the main power at Steps 630 and 640, the system starts to detect the button-pushed state at Step 640 just after the restart of the engine. However, the malfunction is not determined until the anew continuous period X of the button-pushed state elapses at Step 650. The effect that the button-stuck malfunction is determined is thus again outputted on the display so as to notify the crew of the effect at Step 660.

If a crew is not notified of the malfunction notice and manipulates the malfunctioned button during the above predetermined period X at step 650, he cannot understand why the manipulating button is ineffective.

SUMMARY OF THE INVENTION

It is an object of the present invention to provide a button-stuck malfunction notice system that operates quickly in a case that the malfunction of the manipulation buttons has been occurring since a time before an engine of a vehicle stopped until a time after the engine restarted.

To achieve the above object, a button-stuck malfunction notice system is provided with the following. When the button-pushed state continues for more than a predetermined period, button-stuck malfunction information is notified to a crew of the vehicle. Simultaneously the button-stuck malfunction information is stored. Furthermore, in a case that the electric power is turned off and then turned on, when the button-stuck malfunction information is stored and the button-pushed state is still detected, the button-stuck malfunction information is notified again to a crew of the vehicle.

The above structure provides a quick notice system in a case that the malfunction of the manipulation buttons has been occurring since a time before an engine of a vehicle stopped until a time after the engine restarted. Namely, even if a crew who does not know the button-stuck malfunction has been occurring manipulates the malfunctioned button at restarting of the engine, he quickly understands the malfunction is occurring. It prevents the crew from feeling uneasy in no response from the manipulation for the predetermined period.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
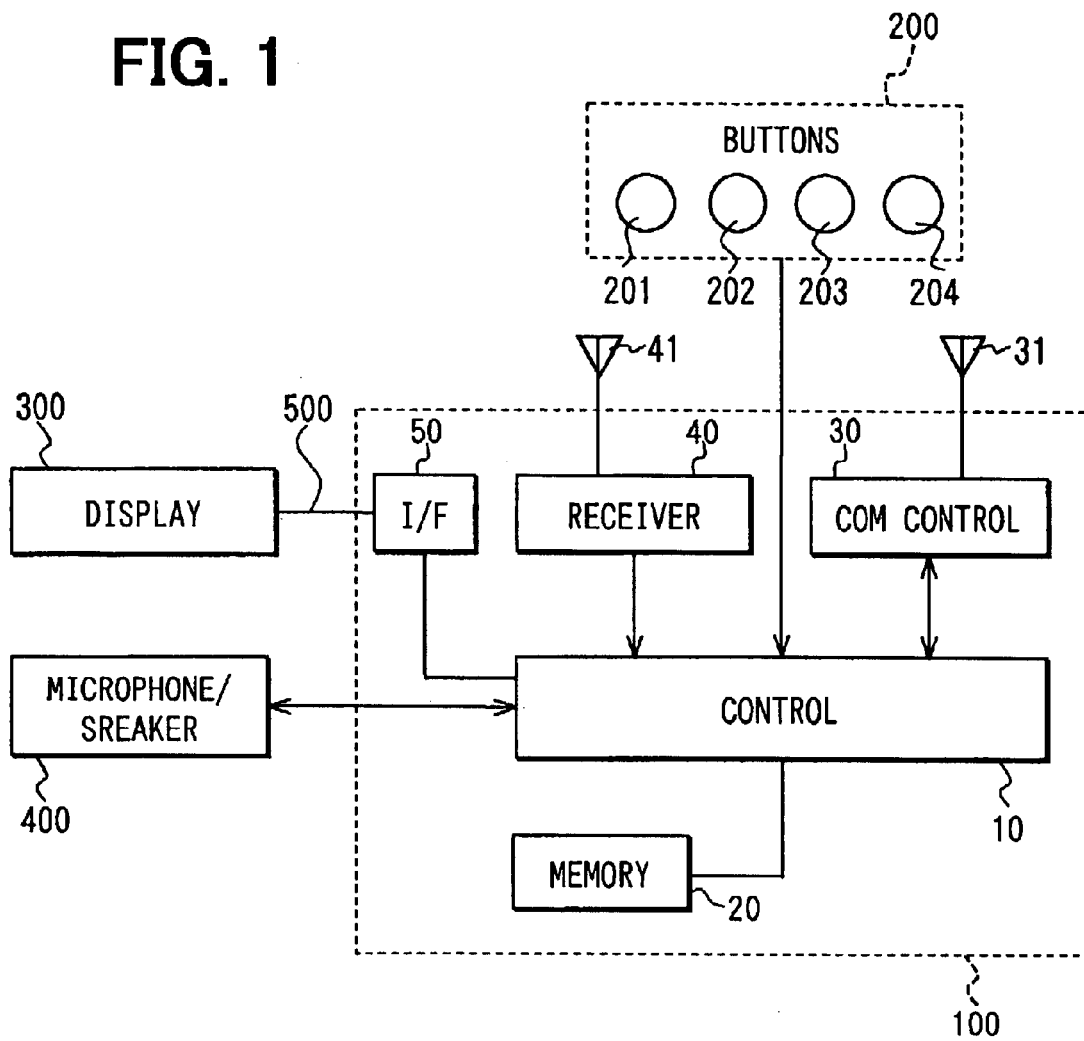
FIG. 1 is a structural block diagram of a button-stuck malfunction notice system according to an embodiment of the present invention.

A button-stuck malfunction (BSM) notice system as an embodiment of the present invention will be explained below, referring to FIG. 1. The button-stuck malfunction notice system installed in a vehicle includes an electronic control unit (ECU) 100, a manipulation button section 200 having manipulation buttons 202 to 204, a display 300 such as LED and LCD, a microphone/speaker section 400, and an in-vehicle local area network (in-vehicle LAN) 500.

The ECU 100 receives a button-input signal from the manipulation button section 200, receives/transmits a voice signal through the microphone/speaker section 400, and transmits a display signal to the display 300 through the in-vehicle LAN 500.

The ECU 100 is equipped with a control 10, a non-volatile memory 20, a communication control (COM control) 30, a communication antenna 31, a global positioning system (GPS) receiver 40, a GPS antenna 41, and an in-vehicle LAN interface (I/F) 50.

The control 10 detects the button-input signal from the manipulation button section 200. The control 10 communicates with the non-volatile memory 20 that stores button-stuck information (explained later).

The control 10 controls the communication control 30, a module for wireless communication, to execute wireless communication with outside of the vehicle. The communication control 30 uses the communication antenna 31 for the wireless communication.

The control 10 obtains current position information of the vehicle through the GPS receiver 40. The GPS receiver 40 uses the GPS antenna 41 for receiving a signal from a GPS satellite.

The control 10 communicates with the in-vehicle LAN 500 through the in-vehicle LAN I/F 50, which route is used for transmitting the display signal to the display 300.

The control 10 receives/transmits the voice signal through the microphone/speaker section 400.

The microphone/speaker section 400 includes a microphone (not shown) for converting voice in a vehicle interior to the voice signal to output to the control 10, and a speaker (not shown) for converting the voice signal from the control 10 to voice to output to the vehicle interior.

The manipulation button section 200 includes an emergency call button 201, an information service button 202, a call button 203, and an END button 204.

The emergency call button 201 is for starting a call with an emergency call center upon occurrence of an emergency state such as an accident or a disaster. Upon pushing of the emergency call button 201, the control 10 controls the communication control 30 to start to call the emergency call center. The control 10 transmits, to the emergency call center, voice of a crew of the vehicle obtained through the microphone/speaker section 400, and outputs the voice signal received from the emergency call center through the microphone/speaker section 400. This enables the crew to communicate with the emergency call center.

The information service button 202 is for obtaining, through communication with outside of the vehicle, information, which the crew desires, such as a weather report in the current position and traffic information. Upon pushing of the information service button 202 for the weather report, the control 10 controls the communication control to start communication with a weather report center. Here, the control 10 also obtains the current position information of the vehicle from the GPS receiver 40 to send to the weather report center. The control 10 thereby receives the weather report around the current position to display on the display 300 for notifying to the crew.

The call button 203 is for starting to call a previously registered person (i.e., a registered phone number). upon pushing of the call button 203, the control 10 controls the communication control 30 to start to call the registered person. Here, the control 10 transmits, to the registered person, the voice of the crew obtained through the microphone/speaker section 400, and outputs the voice signal received from the registered phone number through the microphone/speaker section 400. This enables the crew to communicate with the registered person.

The END button 204 is for terminating the above communication started upon pushing of the emergency call button 201, the information service button 202, and the call button 203. Upon pushing the END button 204, the control 10 controls the communication control 30 to terminate the on-going communication at the point of time.

The above manipulation buttons 201 to 204 typically are released just after being pushed; namely the buttons moves from a button-pushed state to a button-released state. However, the buttons sometimes remain in the button-pushed state without moving to the button-released state (i.e., mechanical button-stuck state) due to a mechanical reason. Here, the button-stuck state means that the button-pushed state continues. In addition, even though the buttons 201 to 204 are released after being pushed, due to an electrical reason such as malfunction of a signal line or output signal from the buttons, the control 10 sometimes continues to detect the button-pushed state (i.e., electrical button-stuck state). These abnormal situations (button-stuck malfunction) should be quickly notified to the crew since the crew cannot properly operate the relevant button.

Figure 2:
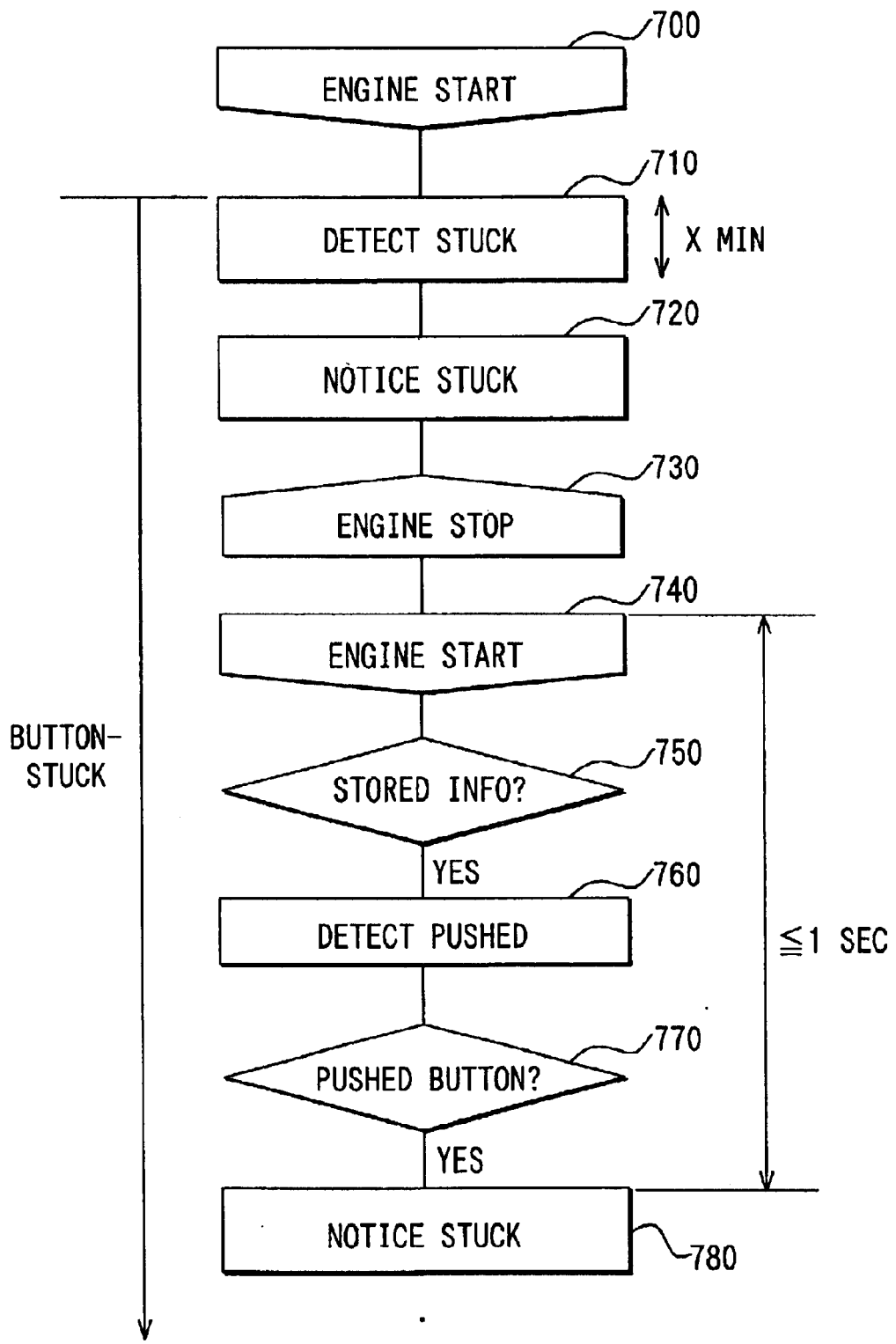
FIG. 2 is a flowchart diagram showing processing of the button-stuck malfunction notice system according to the embodiment.

A flowchart of processing executed in the control 10 of the ECU 100 for the button-stuck malfunction notice system will be explained below, referring to FIG. 2.

When an engine of the vehicle starts at Step 700 and mail power is supplied to the control 10, the control 10 initializes itself to start the processing. Afterward, when the crew of the vehicle pushes the emergency call button 201, the control 10 detects the button-pushed state to control to start to call the emergency call center. Incidentally, even if in the above processing the button continues, after calling to the emergency call center, to be in the button-pushed state (i.e, in button-stuck state), the control 10 is programmed to not control to restart to call.

If the button-pushed state continues more than a predetermined period X (e.g., two minutes), the control 10 determines the button-stuck malfunction to store the button-stuck malfunction information, that the button-stuck malfunction occurs, in the memory at Step 710. Simultaneously, the control 10 controls to display the button-stuck malfunction information to notify the crew at step 720.

When the engine stops and the main power are turned off, the power supply to the control 10 is shut off to stop the control 10 to control at Step 730.

When the engine restarts at Step 740, the control 10 is supplied with the power and initializes itself to restart the processing at Step 740. The control 10 then checks the memory 20 to determine whether the button-stuck malfunction information is stored at Step 750.

When the button-stuck malfunction information is determined to be stored, the control 10 detects the button-pushed state at Step 760 to determine whether the button is being in the button-pushed state. When the button is determined to be in the button-pushed state, the control 10 immediately determines the button-stuck malfunction at Step 770. The control 10 then displays on the display 300 the button-stuck malfunction information to notify the crew of the vehicle at Step 780.

By contrast, when the button-stuck malfunction information is not stored or when the button is not in the button-pushed state, the same processing as that in Step 700 is executed.

Figure 3:
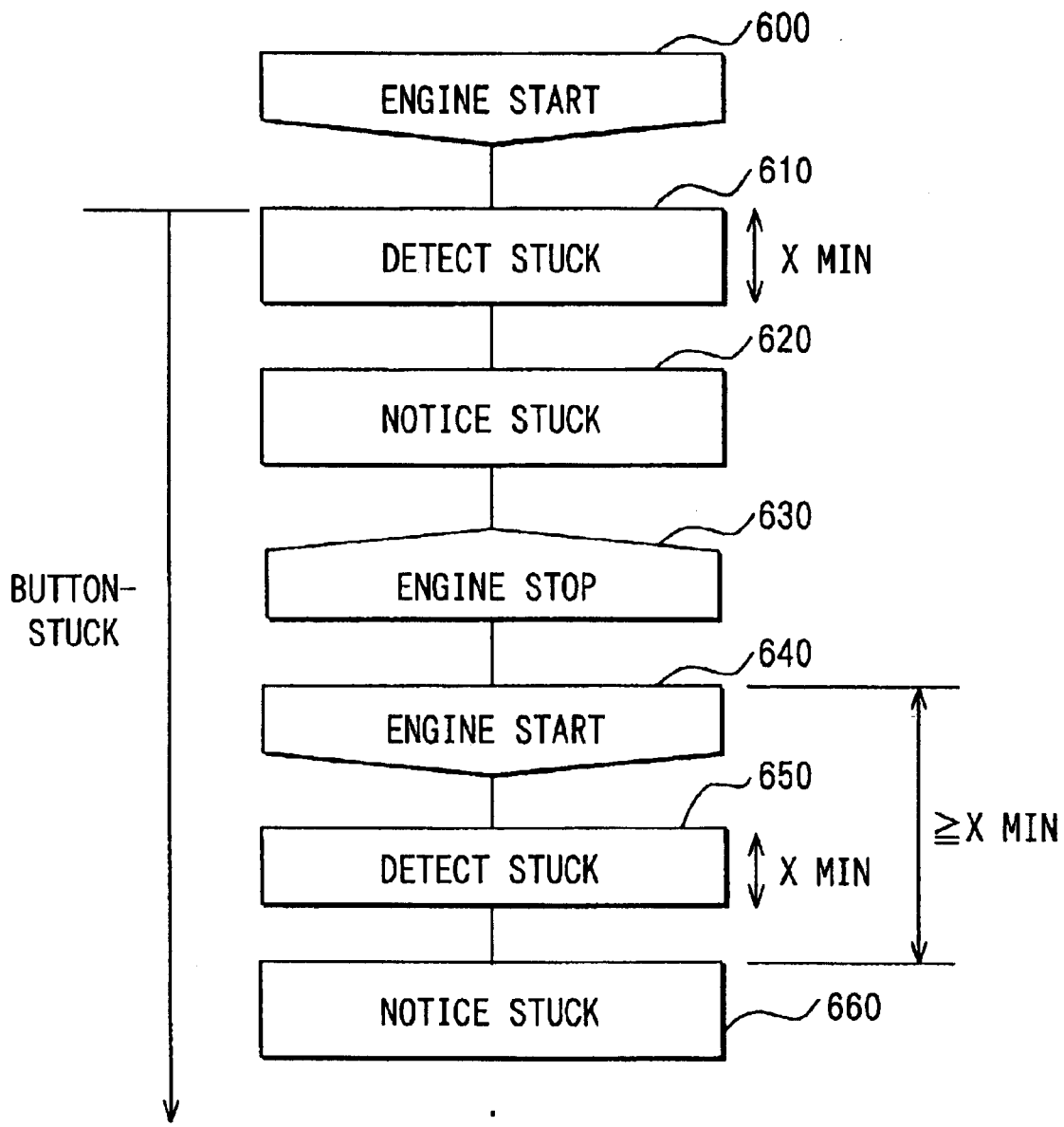
FIG. 3 is a flowchart diagram showing processing of a button-stuck malfunction notice system of a related art.

As explained above, even when the engine starts with holding the button-stuck malfunction, the processing of the embodiment notifies the crew of the malfunction faster than that of the related art shown in FIG. 3. Namely, it takes only about one second to proceed from the restart of the engine at Step 740 through Steps 750, 760, and 770 till the notification of the malfunction information at Step 780. It is much shortly than a few minutes in the processing of the related art shown in FIG. 3.

The above embodiment may is modified as follows.

The malfunction notice of the emergency call button 201 is only explained above. However, the malfunction notice of other buttons of information service button 202, the call button 203, the END button 204 and any other manipulation buttons installed in the vehicle are also executed similarly to processing of the malfunction notice of the emergency call button 201.

At Step 770, the control 10 determines the button-stuck malfunction immediately after the button is determined to be in the button-pushed state. However, the button-stuck malfunction can be determined after the button-pushed state continues for a while, e.g., one second.

Although the non-volatile memory 20 is used in the embodiment, a volatile memory with a backup battery can be adopted as long as the stored information can be retained after the engine stops or main power is turned off.

Although the display 300 is used for notifying the crew of the malfunction information, voice output such as a speaker can be adopted.

Although the on-state and off-state of the main power of the button-stuck malfunction system correspond to the start and stop of the engine respectively, they can correspond to an on-state and off-state of an accessory power for supplying to accessory components. Furthermore, they can correspond to an on-state and off-state of an ignition key of a gasoline engine vehicle, a switch for permitting an engine start in a diesel engine vehicle or a drive motor starter in an electric vehicle, or a power-supplying switch for starting a motor of a vehicle.

The vehicle can include not only an automobile but also a ship or a two-wheel vehicle.

The manipulation button section can be communicated with the control 10 through the in-vehicle LAN 500.

What is claimed is:

1. A button-stuck malfunction notice system that is provided in a vehicle, is supplied with electric power by the vehicle, and includes a manipulation button, the system comprising:

button-pushed state detecting means for detecting a button-pushed state in which the manipulation button is pushed;

button-stuck notifying means for notifying button-stuck malfunction information that button-stuck malfunction occurs to a first crew of the vehicle when the button-pushed state continues for more than a predetermined period;

button-stuck storing means for storing the button-stuck malfunction information; and button-stuck re-notifying means for notifying, to at least one of the first crew and another crew of the vehicle, the button-stuck malfunction information when the button-stuck malfunction information is stored in the button-stuck storing means, when the button-pushed state detecting means detects the button-pushed state, and when the electric power is turned off and then turned on.

2. A button-stuck malfunction notice system according to claim 1, wherein the button-stuck re-notifying means includes:

first determining means for determining whether the button-stuck storing means stores the button-stuck malfunction information, and second determining means for determining whether the button-pushed state detecting means detects the button-pushed state, wherein the button-stuck re-notifying means notifies the button-stuck malfunction information when both of the first determining means and the second determining means determine affirmatively.

3. A button-stuck malfunction notice system according to claim 1, further comprising:

outputting means for outputting the button-stuck malfunction information by the button-stuck notifying means and the button-stuck re-notifying means, wherein the outputting means includes at least one of a display and a speaker.

4. A button-stuck malfunction notice system according to claim 1, wherein the manipulation button includes an emergency call button used for starting to call outside of the vehicle in an emergency state.

5. A button-stuck malfunction notice system according to claim 1, wherein the manipulation button includes an information service button used for obtaining information from outside of the vehicle.

6. A button-stuck malfunction notice system according to claim 1, wherein the manipulation button includes a call button used for calling outside of the vehicle.

7. A button-stuck malfunction notice system according to claim 1, wherein the manipulation button includes a communication-terminating button used for terminating communication with outside of the vehicle.

8. A button-stuck malfunction notice method included in an electronic device that is provided in a vehicle, is supplied with electric power by the vehicle, and includes a manipulation button, the method comprising steps of:

detecting a button-pushed state in which the manipulation button is pushed;

notifying button-stuck malfunction information that button-stuck malfunction occurs to a first crew of the vehicle when the button-pushed state continues for more than a predetermined period;

storing the button-stuck malfunction information; and notifying, to at least one of the first crew and another crew of the vehicle, the button-stuck malfunction information when the button-stuck malfunction information is stored, when the button-pushed state is detected, and when the electric power is turned off and then turned on.

* * * * *